(12) United States Patent
Maloney et al.

(10) Patent No.: US 7,339,770 B2
(45) Date of Patent: Mar. 4, 2008

(54) ELECTROSTATIC DISCHARGE PROTECTION CIRCUIT HAVING A RING OSCILLATOR TIMER CIRCUIT

(75) Inventors: Timothy J. Maloney, Palo Alto, CA (US); Steven S. Poon, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 942 days.

(21) Appl. No.: 10/128,373

(22) Filed: Apr. 24, 2002

(65) Prior Publication Data

US 2003/0202299 A1 Oct. 30, 2003

(51) Int. Cl.
*H02H 3/22* (2006.01)
(52) U.S. Cl. .................................... 361/56; 361/111
(58) Field of Classification Search ............ 361/56–58, 361/91.1, 111
See application file for complete search history.

(56) References Cited

U.S. PATENT DOCUMENTS

| | | | | |
|---|---|---|---|---|
| 4,799,259 A | * | 1/1989 | Ogrodski | 380/46 |
| 4,978,869 A | * | 12/1990 | Dias | 326/101 |
| 5,530,612 A | | 6/1996 | Maloney | |
| 5,570,034 A | | 10/1996 | Needham et al. | |
| 5,838,146 A | * | 11/1998 | Singer | 323/270 |
| 5,852,541 A | * | 12/1998 | Lin et al. | 361/111 |
| 5,900,775 A | | 5/1999 | Tihanyi | 327/543 |
| 5,907,464 A | | 5/1999 | Maloney et al. | |
| 5,946,177 A | * | 8/1999 | Miller et al. | 361/56 |
| 5,956,219 A | * | 9/1999 | Maloney | 361/56 |
| 6,008,970 A | * | 12/1999 | Maloney et al. | 361/56 |
| 6,091,593 A | * | 7/2000 | Lin | 361/111 |
| 6,100,769 A | * | 8/2000 | An et al. | 331/57 |
| 6,114,876 A | * | 9/2000 | Kwong et al. | 326/81 |
| 6,256,184 B1 | | 7/2001 | Gauthier, Jr. et al. | 361/111 |
| 6,304,127 B1 | * | 10/2001 | Lin | 327/321 |
| 6,404,608 B1 | * | 6/2002 | Pryor et al. | 361/93.1 |
| 6,424,510 B1 | * | 7/2002 | Ajit et al. | 361/59 |
| 6,486,727 B1 | * | 11/2002 | Kwong | 327/534 |
| 6,515,550 B2 | * | 2/2003 | Demsky et al. | 331/57 |
| 6,801,416 B2 | * | 10/2004 | Hatzilambrou et al. | 361/56 |
| 6,958,896 B2 | * | 10/2005 | Lin et al. | 361/56 |
| 2002/0113657 A1 | * | 8/2002 | Dufour | 331/57 |

OTHER PUBLICATIONS

Timothy J. Maloney et al. "Stacked PMOS Clamps for High Voltage Power Supply Protection," pp. 1-8, Orlando, FL, Sep. 27-30, 1998, Paper 2A.2, 21st EOS/EJD Symposium.
T.J. Maloney, "Designing Power Supply Clamps for Electrostatic Discharge Protection of Integrated Circuits," *Microelectronics Reliability* pp. 1691-1703, in 1998.

* cited by examiner

*Primary Examiner*—Michael Sherry
*Assistant Examiner*—Danny Nguyen
(74) *Attorney, Agent, or Firm*—Schwegman, Lundberg & Woessner, P.A.

(57) ABSTRACT

An electrostatic discharge protection circuit is provided having a first electrically conductive element (such as a current sinking transistor) to couple between a power source and a first node. The first electrically conductive element has a control input terminal. A discharge path control circuit having an output terminal couples to the control input terminal of the first electrically conductive element. A timer circuit having an output terminal couples to the input terminal of the discharge path control circuit. A ring oscillator timer circuit having an output terminal couples to an input terminal of the timer circuit. The ring oscillator timer circuit may include a series of inverter circuits and/or counter circuits (such as flip-flop circuits).

30 Claims, 8 Drawing Sheets

ELECTROSTATIC DISCHARGE PROTECTION CIRCUIT HAVING A RING OSCILLATOR TIMER CIRCUIT

FIELD

The present invention is directed to electrostatic discharge protection for integrated circuits. More particularly, the present invention is directed to a timer circuit for an electrostatic discharge protection circuit.

BACKGROUND

As is well known, the build-up of static charge may lead to extremely high voltage developed near an integrated circuit (IC). Electrostatic discharge (ESD) refers to the phenomenon of the electrical discharge of high current for short duration resulting from the build up of static charge on a particular IC package, or on a nearby human handling that particular IC package. ESD is a serious problem for semiconductor devices since it has the potential to destroy an entire IC. Since ESD events occur often across the silicon circuits attached to the package terminals, circuit designers have concentrated their efforts on developing adequate protection mechanisms for these sensitive circuits.

Ideally an ESD protection circuit should be able to protect an IC against any conceivable static discharge by non-destructively passing large currents through a low impedance path in a short time.

One technique to protect the components (e.g., transistors, inactive devices, etc.) of an integrated circuit from an electrostatic discharge (ESD) event is to add circuitry intended to sink or remove the charge associated with the ESD event. For example, a wide clamping device (e.g., a transistor having a width significant to allow the charge to draw away without creating a damaging current density) may be placed in parallel or in series with the portion of the integrated circuit to be protected. Due to the width of the clamping device, it may sink the charge associated with the ESD device and alleviate high voltage levels that may otherwise result.

However, as manufacturing techniques improve, the channel length of transistors is typically reduced and gate oxides thinned, which, in turn, may increase the leakage of the transistors. Consequently, the clamping devices may become a significant source of leakage current while the integrated circuit is in operation. Thus, there is a continuing need for better ways to provide charge protection to an integrated circuit that has reduced leakage currents.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
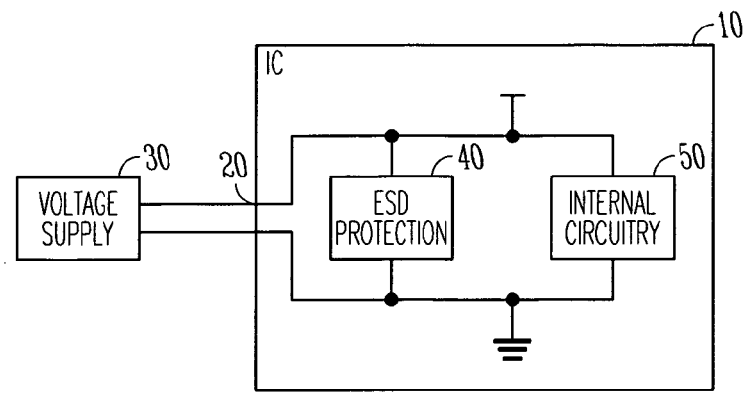
FIG. 1 is a block diagram of an integrated circuit according to one arrangement.

In the following detailed description, like reference numerals and characters may be used to designate identical, corresponding or similar components in differing figure drawings. With regard to description of any timing signals, the terms HIGH and LOW may be used in an intended generic sense. More particularly, embodiments of the invention are not limited to the illustrated/described signals, but could be implemented with a total/partial reversal of any of the signals by a simple change in logic. Additionally, well-known power/ground connections to integrated circuits (ICs) and other components may not be shown within the FIGS. for simplicity of illustration and discussion, and so as not to obscure the invention.

FIG. 1 is a block diagram of an integrated circuit 10 which has a voltage supply input connection 20 for receiving an externally provided high supply voltage from supply circuit 30. An ESD protection circuit 40 is provided to protect internal circuitry 50, designed to perform a predetermined function, from electrostatic discharge. The integrated circuit 10 can be any type of integrated circuit which receives a supply voltage, including, but not limited to processors, controllers, memory devices, and application specific integrated circuits (ASIC).

Figure 2:
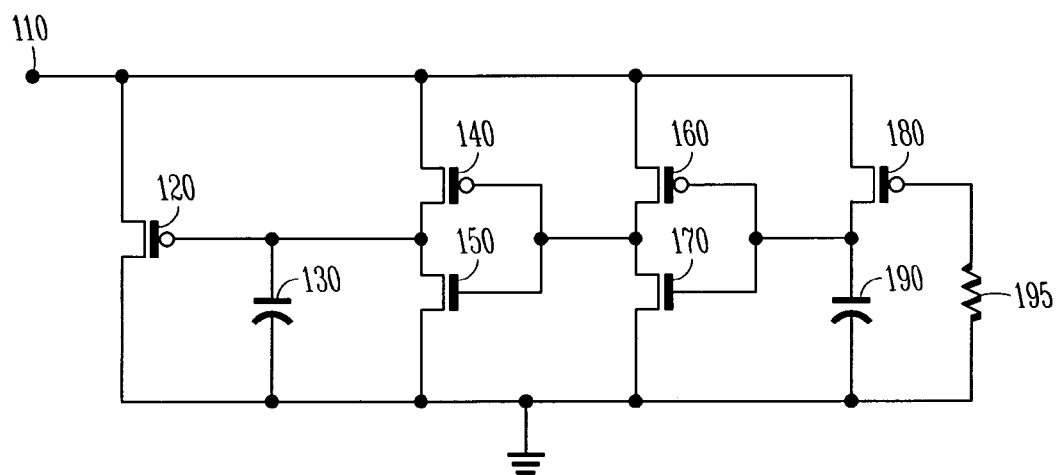
FIG. 2 is a circuit diagram of a power supply clamp according to one arrangement.

FIG. 2 is a circuit diagram of a circuit employing an RC-timer according to one arrangement. Other arrangements are also possible. FIG. 2 includes an arrangement of a power supply clamp circuit that may be employed in ICs as one element of a circuit network to reduce the likelihood of catastrophic damage that may occur due to an electrostatic discharge (ESD) event. Such events are well known in the art and may result from an electrically charged body being discharged into an IC, for example. In this arrangement, the RC-timer may include a capacitor 190, a resistor 195 and a p-channel transistor 180. Such a circuit may be coupled between a power supply terminal 110 and ground.

The transistor 180 may function as the resistance for the RC timer and may have a resistance in the Mega-ohm range. In normal operation, once the capacitor 190 has charged to a voltage substantially above the threshold of the inverter (formed by transistors 160 and 170), the inverter may "trip." For this particular arrangement, this inverter may be termed a first drive stage for a current sinking device 120. In this context, tripping such an inverter may result in such an inverter changing states. For this scenario, for example, the inverter may transition from asserting the voltage applied to the terminal 110, via the transistor 160, to asserting ground, via the transistor 170, on the gates of transistors 140 and 150, which together form a second inverter. The second inverter may be termed a second drive stage for the current sinking device 120 (or current sinking transistor). Likewise, the voltage asserted on the power supply terminal 110 may be asserted on the gate of the transistor (i.e., the current sinking device 120) via the transistor 140, thereby turning OFF the current sinking device 120. A capacitor 130 may be coupled between the gate of the current sinking device 120 and ground. For this particular arrangement, until the foregoing sequence is completed, the power supply terminal 110 may be clamped to ground.

Typically, in such an arrangement, the time required to charge an RC-timer, "trip" the two inverters and turn OFF the current sinking transistor, may be of a duration that would not result in physical damage to, for example, metal lines used for power distribution in such ICs. However, the time required for such a sequence may typically be longer than the duration of most ESD events. Also, because such circuits are designed to turn the current sinking device OFF after a certain duration during typical operation, they typically allow circuits in which they are employed to operate normally after the current sinking device is turned OFF, usually a time in the duration of several micro-seconds.

As those of skill in the art would appreciate, during an ESD event, tripping the inverters and turning OFF the current sinking transistor may also be based, at least in part, on the higher voltage applied to the power supply terminal 110 associated with such an event. Such a situation may typically result in the current sinking device (namely the transistor) 120 remaining ON during such an ESD event, as is desirable. These attributes of such a power supply clamp may allow such a circuit to be employed to protect other circuit elements from potential damage or destruction resulting from the current and/or voltage of an ESD event. In this respect, such a is circuit may shunt current between the power supply terminal 110 and ground during such an ESD event.

Also, ICs may be manufactured with different semiconductor manufacturing processes in conjunction with one another. In this situation, these ICs may employ different power supply voltages. In this regard, while one IC may be manufactured 20 using a current generation process, another IC may be manufactured using an older process and employ a higher power supply voltage. In this respect, one technique that may be employed in such a situation is the use of a voltage-tolerant circuit.

Figure 3:
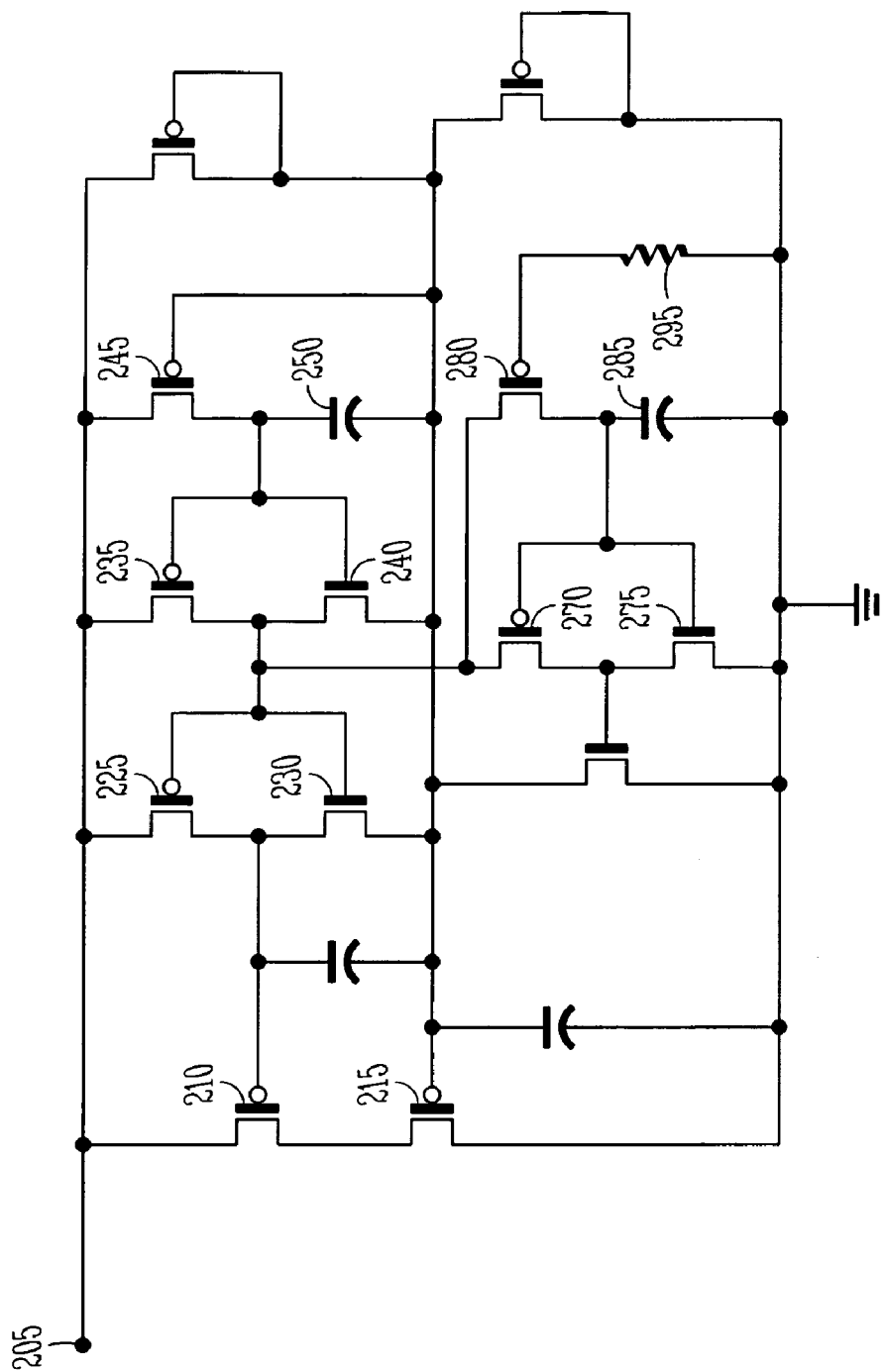
FIG. 3 is a circuit diagram of a voltage-tolerant power supply clamp according to one arrangement.

FIG. 3 is a circuit diagram of a voltage-tolerant power supply clamp according to one arrangement. Other arrangements are also possible. For this particular arrangement, the circuit is designed to be "voltage-tolerant" by employing, for example, stacked current sinking devices 210 and 215 (or current sinking transistors). Similarly in this regard, the RC-timer for this arrangement is "stacked" or "staged." The first "stage" of the RC timer includes a p-channel transistor 245 and a capacitor 250, and the second stage includes a p-channel transistor 280, a capacitor 285 and a resistor 295. One of skill in the art would understand that this arrangement may act as a divider and allow the circuit to "tolerate" signals from an IC employing a higher power supply voltage, as may be associated with ICs manufactured on a previous generation process.

The RC-timer stages in FIG. 3, and their associated control circuitry, such as, for example, the three inverters (formed by transistors 235 and 240; transistors 225 and 230; and transistors 270 and 275) may turn OFF the current sinking devices 210 and 215 (formed by the stacked p channel transistors) after a time duration on the order of microseconds. Likewise, during an ESD event, the RC-timer stages and their associated control circuitry may allow the current sinking devices 210 and 215 to remain ON in order to shunt current from such an event between a power supply terminal 205 and ground. Therefore, a voltage-tolerant power supply clamp may allow normal operation of an IC once the current-sinking devices 210 and 215 are turned OFF by employing the RC-timer stages and their associated control circuitry while also supplying the associated benefits of protection from ESD events.

The functionality of circuits employing RC-timers may be adversely affected by, at a minimum, gate leakage characteristics of future generations of semiconductor manufacturing processes. In this regard, because capacitors in ICs typically include gate oxide, such leakage may result in circuits that employ such capacitors, such as RC-timers, not functioning as desired. For example, for the FIG. 2 arrangement, if the capacitor 190 included a gate oxide with leakage on the order of that previously discussed for future processes, the RC-timer including the capacitor 190 and the transistor 180 may not charge to a voltage that is high enough to completely "trip" the inverter (formed by the transistors 160 and 170). That is, the inverter may operate in the linear region and conduct current between the power supply terminal 110 and ground. In such a situation, the inverter (formed by the transistors 140 and 150) may, in turn, operate in the linear region, which may result in the current sinking device 120 remaining partially ON, which is also in a linear mode. Such a situation may be disadvantageous as an undesired amount of current may be conducted from the power supply terminal 110 to ground. This current may, in turn, result in adverse effects on a circuit employing such a power supply clamp. A similar situation may result from the FIG. 3 circuit due, at least in part, to such leakage current through the capacitor 250, for example. Therefore, alternative RC-timers may be desirable.

Figure 4A:
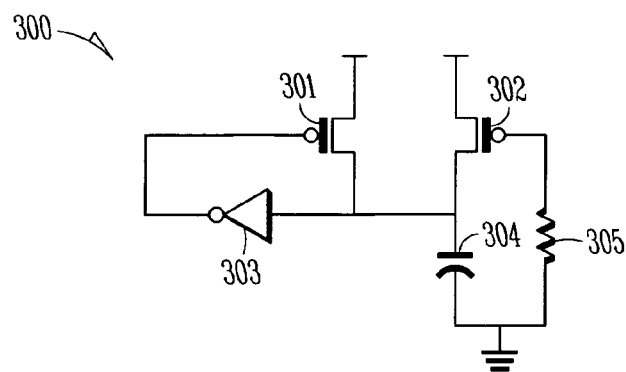
FIG. 4A is a circuit diagram of an RC-timer according to one arrangement.

FIG. 4A shows an RC-timer 300 according to one arrangement. Other arrangements are also possible. This particular arrangement of an RC-timer includes a transistor 302, an inverter 303, a capacitor 304, a resistor 305, and a transistor 301. In a similar manner as described above, the transistor 302 may act as a resistor in the Mega-ohm range for such a timer. However, the transistor 301 may be a short channel transistor having a substantially lower resistance than the transistor 302. Therefore, once the capacitor 304 charges to a voltage above the trip point of the inverter 303, that inverter may turn ON the transistor 301, which may, in turn, electrically couple the positive plate of the capacitor 304 to the power supply terminal via the transistor 301. Since the transistor 301 has a substantially lower resistance than the transistor 302, it may, therefore, allow the inverter 303 to better transition states, or, that is, reduce the likelihood it will operate in the linear mode, as is desired. In this situation, current through the inverter 303 may be reduced and, therefore, any amplification of that current by circuitry coupled to such an RC-timer may also be reduced.

Figure 4B:
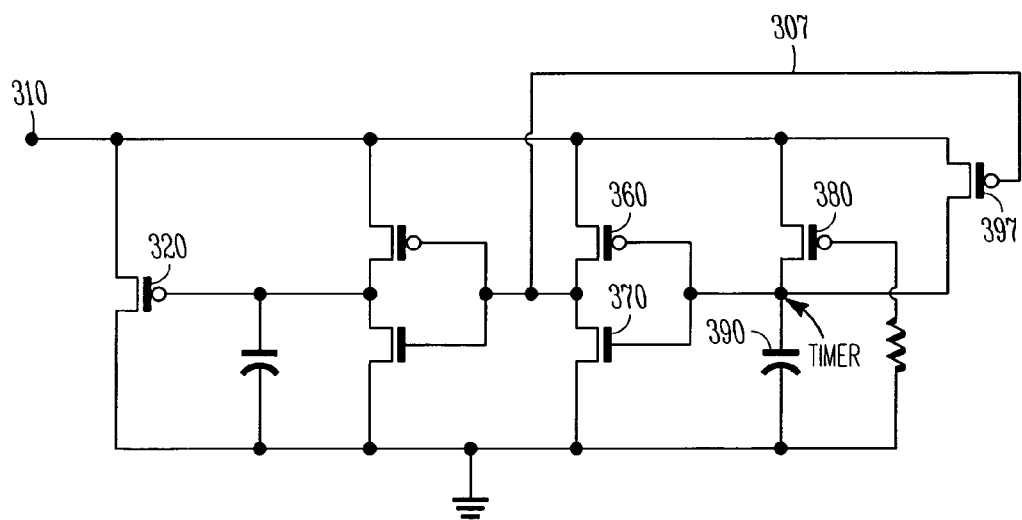
FIG. 4B is a circuit diagram of a power supply clamp according to one arrangement.

FIG. 4B shows a power supply clamp 307 according to one arrangement. Other arrangements are also possible. This power supply clamp employs an RC-timer similar to the RC-timer 300 shown in FIG. 4A. For this particular arrangement, the RC-timer includes transistors 380 and 397, a capacitor 390, and an inverter formed by transistors 360 and 370. The inverter may also be employed as a first drive stage for a current sinking device 320 (or current sinking transistor). Use of the output voltage of the inverter to drive the gate of the transistor 397 may be advantageous as it may reduce the amount of circuitry. As was previously discussed with respect to the RC-timer 300, the transistor 397 may be a short channel device and may compensate for leakage in the capacitor 390 in a similar fashion as discussed above with respect to the transistor 301. In this respect, once the capacitor 390 is charged to a voltage sufficient to begin to trip this inverter, the inverter may turn ON the transistor 397, which, in turn, may electrically couple the positive plate of the capacitor 390 to a power supply terminal 310 via a low resistance. Such an arrangement may reduce the effects of leakage in the RC-timer and allow the current sinking device 320 to be sufficiently turned OFF such that it may not affect the normal operation of such an IC.

With substantial gate current in the thin oxides (0.13 micron), including the RC timer's capacitor oxide, a latching circuit may be used. If the latching is not present, then the capacitor and long-channel FET may become a voltage divider, causing the common RC node (labeled "TIMER" in FIG. 4B) to settle at a point too low to flip the inverter. The inverter needs to flip to achieve timeout of the circuit.

Because gate current varies with oxide thickness, and the current is even stronger in more advanced processes, circuits must be modeled carefully and process corners carefully examined. The above-described circuits may have some problems. For example, the long-channel resistive PMOS device used in the RC timer (shown as the transistor 380 in FIG. 4B and having a 0.28/35 micron size) may have practical limits on its channel length due to its own gate current. Very long channel lengths may not be useful. First, the long channel resistive device (i.e., the transistor 380) must supply enough current to the leaky capacitor to charge it up to the trip point of the inverter (formed by the transistors 160 and 170), thus limiting the channel lengths. Second, the drain to gate of the long channel device (i.e., the transistor 380) may start to leak to ground as the capacitor 390 charges up, starving the transistor 380 of drain current and stopping the charge up of the capacitor 390, and again limiting the useful channel length. The result is that much shorter channels (<10 um) may have to be used for the long channel device, and the resulting time constant for the timer may drop below 1 microsecond. The time constant may be less than 100 nanoseconds, and just barely acceptable for clamping human body model (HBM) ESD events.

Figure 5:
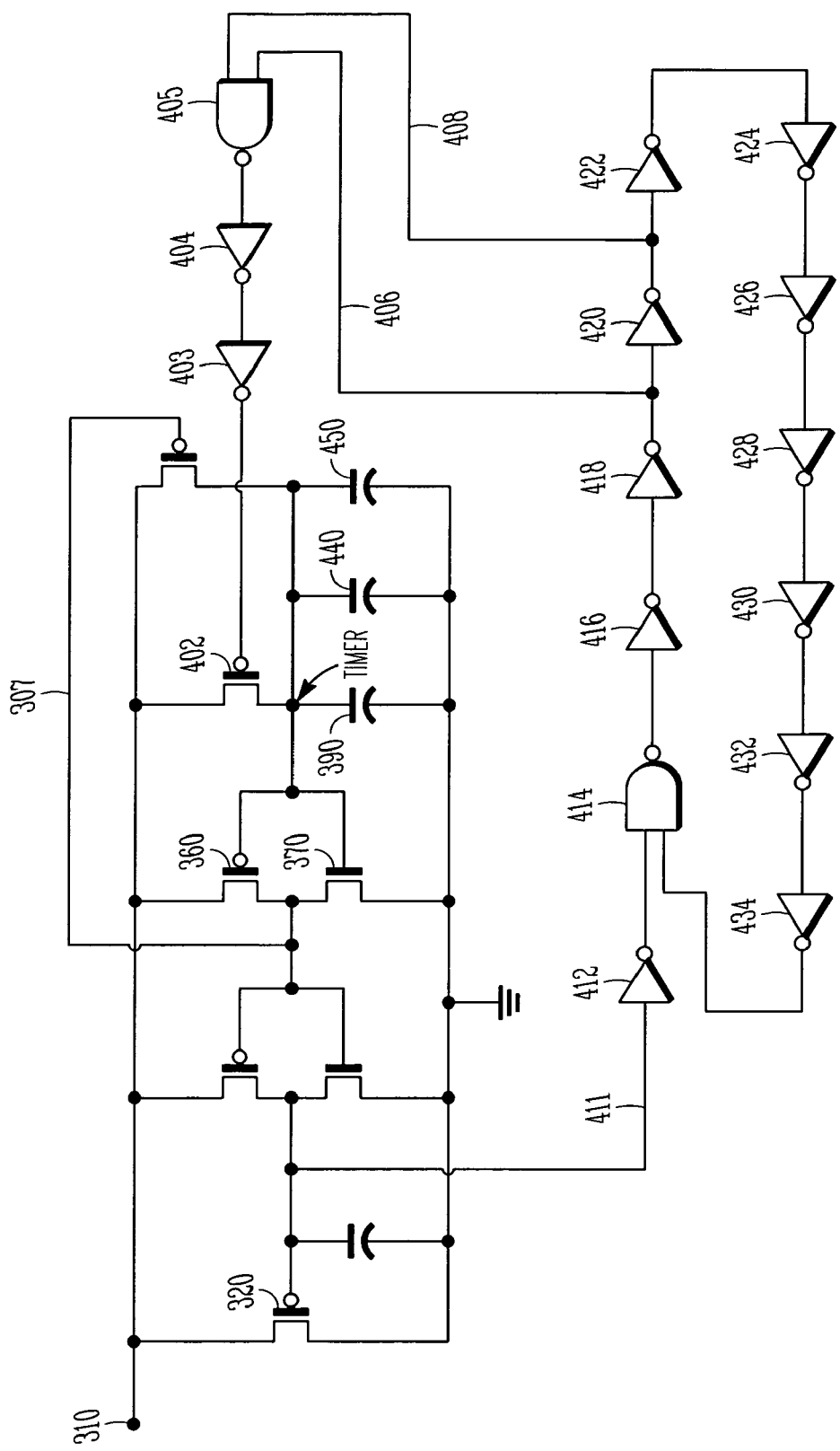
FIG. 5 is a circuit diagram an ESD power supply clamp using a ring oscillator timer circuit according to an example embodiment of the present invention.

FIG. 5 is a circuit diagram of an ESD power supply clamp using a ring oscillator timer circuit according to an example embodiment of the present invention. The ring oscillator timer circuit may also be referred to as a ring oscillator clamp circuit. Other embodiments and configurations are also within the scope of the present invention. The power supply clamp of FIG. 5 utilizes a shorter channel device (i.e., a transistor 402) than the FIG. 2 arrangement and having a gate grounded with a low duty cycle that is achieved by use of a ring oscillator (RO) circuit. The ring oscillator circuit may include a series of invertors 412, 416, 418, 420, 422, 424, 426, 428, 430, 432, 434, and a NAND gate 414 coupled in series. The series of inverters acts as a ring oscillator. The RO circuit may receive an input signal along a signal line 411 to the inverter 412. The signal may propagate around the series of inverters and the NAND gate 414, which may be considered a pass-through gate. The RO circuit may be coupled by signal lines 406 and 408 to a NAND gate 405, which outputs a signal through an inverter 404 and an inverter 403 to the gate of the transistor 402. In this example, the RO circuit is an eleven-stage ring oscillator circuit formed by the eleven inverters coupled in series. Other numbers of stages and configurations of the RO circuit are also within the scope of the present invention.

Grounding of the gate of the transistor 402 may cause a current pulse into the capacitor 390. The grounding may occur based on inputs to the NAND gate 405 (along the signal lines 406 and 408) from the ring oscillator circuit. In particular, the grounding may occur when both inputs to the NAND gate 405 are HIGH. In this example, the signal line 406 may be coupled to a node between the inverter 418 and the inverter 420 and the signal line 408 may be coupled to a node between the inverter 420 and the inverter 422. The grounding of the gate of the transistor 402 may take place for a very short time once per complete cycle of the ring oscillator circuit. This may occur when the inverter 418 changes state from a HIGH to a LOW. Thus, the transistor 402 (such as a 4 um long resistive device) may become effectively a much higher value of resistance since it has a grounded gate.

However, relief may be needed from the effects of the gate current of the capacitor 390, as too high an effective resistance may not be able to charge up the capacitor 390 to the trip point of the inverter (formed by the transistors 360 and 370). The transistor 402 may serve as a very high resistance and therefore a non-leaky thick oxide capacitor may be used in the RC timer. FIG. 5 shows leakproof capacitors 390 and 440 made by utilizing the area and edge capacitance of the poly to metal 1. FIG. 5 also shows a small (4/4) leaky thin gate capacitor 450 that may increase the capacitance and balance the continued leakage from the inverter (formed by the transistors 360 and 370).

In one example, the RO clamp circuit may be 68 um wide and 47 um tall and may be built with 2000 um of clamping FET width. The RO clamp circuit may be made half-size on a test chip. Other dimensions are also within the scope of the present invention.

Where the RO clamp circuit shown in FIG. 5 is fabricated using a 0.13 um process, the RO clamp circuit may be optimized to have a turn-off time of 600 nanoseconds, as compared to disadvantageous arrangements having a turn-off time of 150 nanoseconds. Thus, the RO clamp circuit may be designed to turn OFF much closer to a desired time.

The RO clamp circuit provides a low duty cycle pulse to the gate of the transistor 402 (i.e., the long-channel PMOS device). The low duty cycle pulse may be achieved by the NAND gate 405 triggering once every other time that a signal propagates around the RO clamp circuit. The RO circuit may be deliberately made slower by use of longer-channel devices for the RO inverters. The drive cycle may be reduced further by using 1.5 um channel lengths in the inverters 418 and 420 (which drive the signal lines 406 and 408 to the NAND gate 405), and using 2 um channels for the remainder of the RO's inverters. Thus, the transistor 402 may have a high effective resistance due to its gate being pulsed, a resistance directly in proportion to the number of stages in the RO, and thus in proportion to the area used for the RO circuitry. Accordingly, the time constant of the trigger circuitry may scale in proportion to the area used for the RO circuitry.

For the very low duty cycle pulse on the (PMOS) gate, the efficiency of the circuit may be increased so that the area grows with the log of the desired time constant, rather than growing linearly with time. This may be done using counter circuits following a minimal (such as 5 stages) RO circuit to produce the basic oscillator. For example, a binary counter having eight NAND gates and an inverter in each stage may reduce the RO frequency by a factor of 2× per stage.

Figure 6:
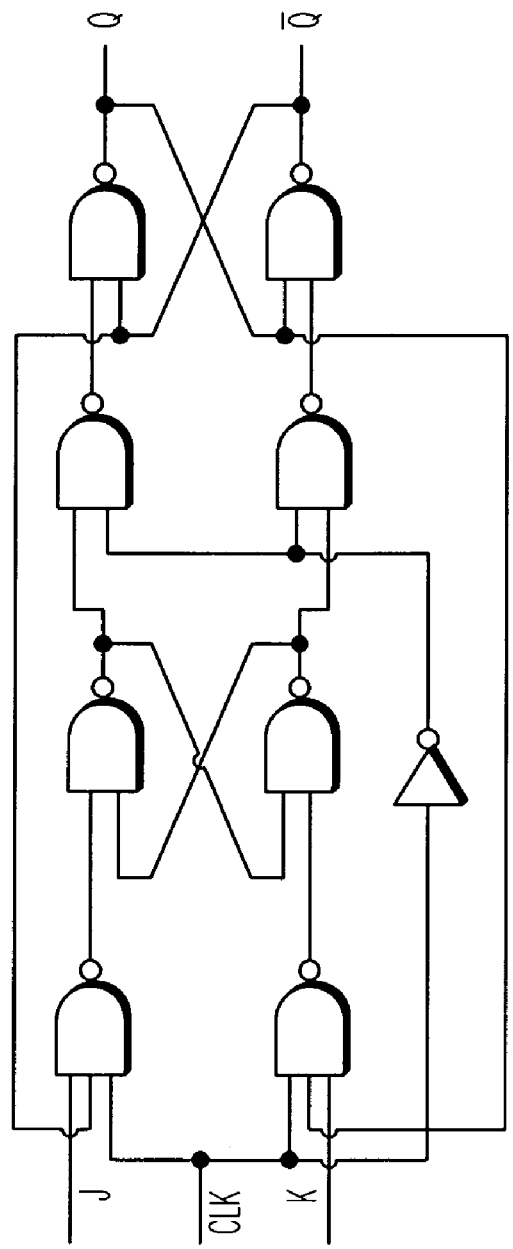
FIG. 6 illustrates a JK flip-flop circuit for use as a binary counter.
Figure 7:
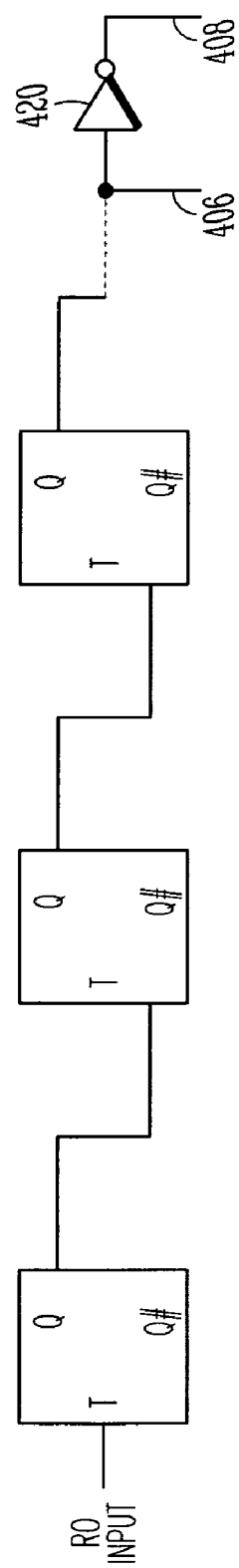
FIG. 7 illustrates a T flip-flop circuit for use as a binary counter.

FIG. 6 is a circuit diagram showing JK flip-flop circuits configured as a T (toggle) flip-flop (J=K=1) so that the RO input in FIG. 7 (at CLK=T) is divided by two when emerging at Q or Q#. This configuration or a similar configuration may be used in substitution for inverter stages of the RO timer circuit. Other arrangements are also possible.

FIG. 7 is a circuit diagram showing three T flip-flop circuits cascaded to form a binary counter with the output signal producing a pulse on the signal lines 406 and 408 of FIG. 5. This configuration or a similar one may be used in substitution for inverter stages of the RO timer circuit. Each T flip-flop circuit may be nearly the same size as the eleven-stage RO circuit shown in FIG. 5.

However, a counter circuit may be more advantageous if multiple stages are used because of the exponential growth of the time between pulses on the final output. This may be seen by comparing the area A used by the RO circuit and the area A used by the counter circuits for a given timer scheme. As will be described, the time period T is the time between PMOS gate pulses (such as the gate of the transistor 402). For simplicity, the area A1 of a NAND gate (as in FIGS. 5 and 6) may be the same as the area of a RO inverter stage, which is reasonable given the non-minimum channel lengths of the RO circuit elements.

The inverter 412 and the NAND gates 414 and 405 are utilized in both a pure RO circuit (such as FIG. 5) and a counter RO circuit (using circuits similar to FIG. 6 and FIG. 7). In both a pure RO circuit and a counter RO circuit, the output pulse length may be set by the delay of an inverter the size of the inverter 420 in FIG. 6, so that the duty cycle depends on the time delay T between pulses. The area A may be estimated as a function of T for both the pure RO circuit and the counter RO circuit.

For a pure RO circuit, the time delay T depends on the number of ring oscillator stages, having average time delay $t_1$. In FIG. 5, a pulse may occur every time period of $22t_1$, so for an RO with q stages (q must be odd), $T=2qt_1$. This may be accomplished by an area $A=(q-1)A1$. Therefore $$A(T) = \left(\frac{T}{2t_1} - 1\right) A1.$$

As may be seen, the area A (T) for a pure RO circuit grows linearly with the desired time delay T as expected.

For a counter RO circuit, a minimal 5-stage RO circuit may have four inverters beyond the required NAND stage (such as the NAND gate 414). The RO period will be $10t_1$, but that is expanded by $2^n$, where n is the number of counter stages. Thus $T=10(2^n t_1)$. Meanwhile $A=(4+9n)A1$. Solving, $$A(T) = A1\left(4 + 9\log_2\left(\frac{T}{10t_1}\right)\right).$$

This area A (T) for a counter RO circuit grows as the log of T, as expected.

Thus, if a time delay requiring a few stages of the counter following the RO is appropriate, there may be an area advantage to using a counter RO circuit due to the logarithmic area scaling. The breakeven point may be at n=3 stages of the counter RO circuit, where A=31A1 for the counter RO circuit and A=38A1 for a roughly equivalent pure RO circuit, which is about a 20% area saving. The counter advantage beyond the breakeven point of n=3 is clear. As such, counters can be a useful design tool in implementing the RO clamp circuit, and may be integrated with design objectives for the entire circuit.

Embodiments of the present invention are also applicable to a PMOS power supply clamp with high voltage tolerance (i.e., voltage beyond limits of thin gate oxides). In this design, the thin gate clamping devices and bias circuitry may be stacked to withstand the voltage; meanwhile the circuit produces strong gate drive of the clamping FETs during an ESD pulse. These same high-voltage ESD clamps may also be outfitted with bias circuitry for low standby current without disturbing functionality.

High voltage ESD clamps may be built with a single RC timer circuit, despite the multiple stages of the stacked design. The RO timer circuitry may work in the same way as the other RC timer arrangements, and a single unit may be employed in a stacked high-voltage ESD clamp. In order to better illustrate this, FIG. 8 will be first described with respect to a timer circuit according to one arrangement and then FIG. 9 will be described with respect to a ring oscillator circuit according to an example embodiment of the present invention. FIG. 3, as described above, is another example arrangement of a voltage-tolerant power supply clamp.

Figure 8:
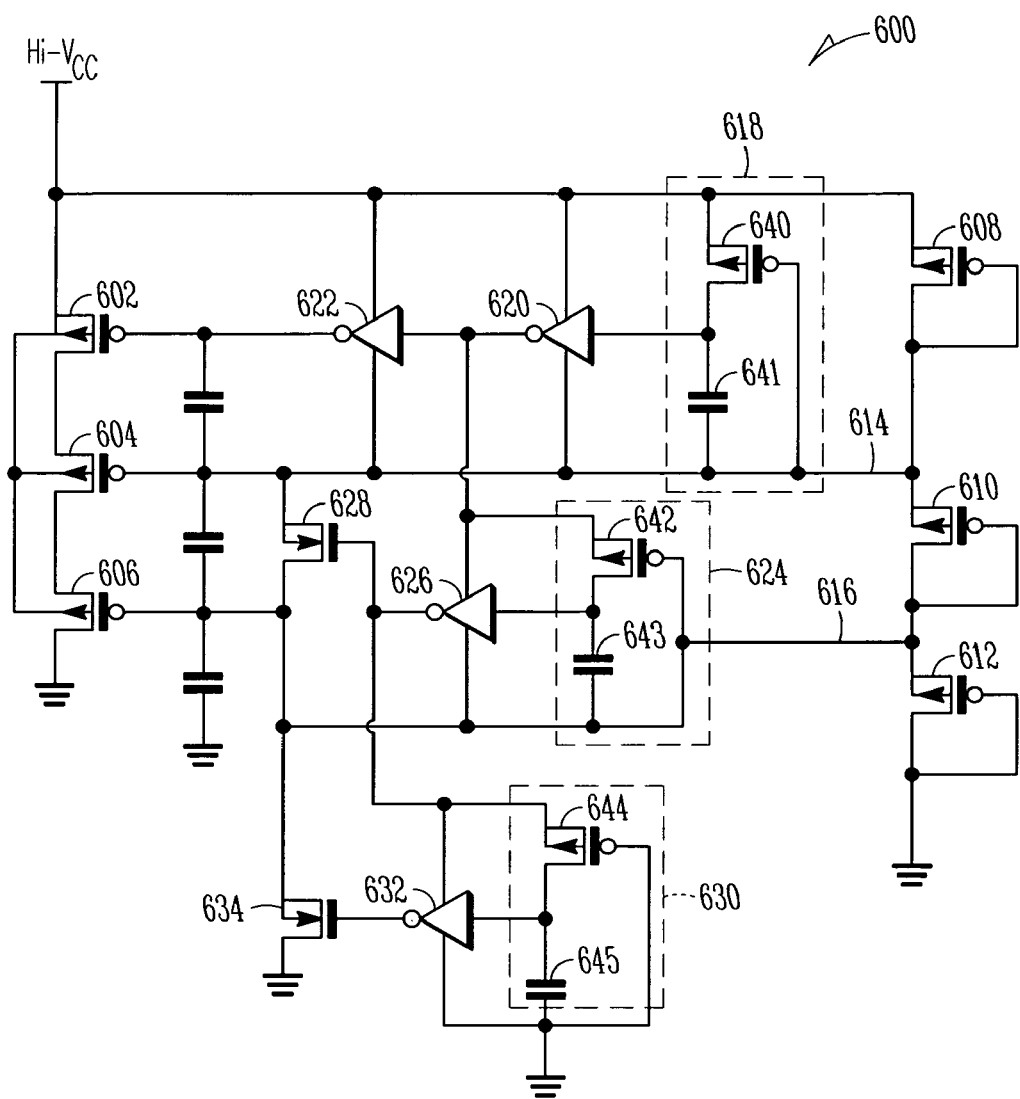
FIG. 8 is circuit diagram of a clamp circuit having a stacked-gate PMOS transistor according to one arrangement.

FIG. 8 shows a PMOS clamp circuit 600 for use in high voltage tolerant circuits according to one arrangement. Other arrangements are also possible. The clamp circuit includes a switchable current sinking circuit including stacked PMOS transistors 602, 604 and 606. A voltage divider circuit of the clamp has a diode coupled PFET 608 coupled between a power supply and a first intermediate node 614. A second diode coupled PFET 610 is coupled between the first intermediate node 614 and a second intermediate node 616. A third diode coupled PFET 612 is coupled between the second intermediate node 616 and ground. Thus, the power supply potential may be divided into two reduced voltages on the nodes 614 and 616, which are appropriate for long-term exposure on a single transistor gate oxide.

The series coupled transistors 602, 604 and 606 form a switchable conductive circuit between Hi-Vcc and ground. These transistors 602, 604 and 606 may be switched ON to conduct current, or, one or all may be switched OFF so that substantially no current flows. One skilled in the art will recognize that some very small current may flow due to leakage or sub-threshold conduction mechanisms, even though the transistors 602, 604 and 606 are still considered to be OFF. The PFETs 602, 604 and 606 may be provided in the same n-well, thus allowing minimum spacing between the gate electrodes of the two transistors.

To achieve steady state low leakage current, it is only necessary to turn OFF one of the series coupled PFETs 602, 604 and 606. Preferably, the transistor electrically adjacent to the power supply node is turned OFF to achieve the steady state low leakage current. This is accomplished when the gate of transistor 602 is pulled up to substantially the voltage of the power supply node through an inverter 622. This may occur when the input of an inverter 620 is pulled high as an RC timer circuit 618 settles down. The RC timer circuit 618 may include a transistor 640 and a capacitor 641. The gate of the transistor 640 may be coupled to the first intermediate node 614. Because the clamp circuits uses three PFETs 602, 604 and 606, three pull-down devices or inverters 622, 628 and 634 may be used to pull the gates of the PFETs 602, 604 and 606 to ground. The circuitry operates in substantially the same manner as the circuit of FIG. 3. That is, each PFET may have a pull down device activated by an inverter circuit, which has its supply pulled to a high voltage during an ESD event.

During non-ESD event operations, the inverter 622 turns the transistor 602 OFF. During an ESD event, the voltage on Vcc is pulled higher, and the voltages on the gates of PFETs 602, 604 and 606 are pulled to ground so that the multiple gate FET is turned ON hard during an ESD pulse. That is, in response to an increase in the voltage on Vcc, the RC timer circuit 618 keeps the input of the inverter 620 sufficiently high to couple the inverter output to Vcc. As a result, the input of the inverter 622 is pulled sufficiently high (close to Vcc) to fully couple the gate of the transistor 602 to the first intermediate node 614, without a Vt drop through the inverter 622.

With the input of an inverter 626 held substantially constant by an RC timer circuit 624, the output of the inverter 626 is coupled to Vcc through the inverter 620. The RC timer circuit 624 may include a transistor 642 and a capacitor 643. The gate of the transistor 642 may be coupled to the second intermediate node 616. Thus, the elevated inverter 626 outputs pull the gate of the transistor 628 to a high voltage. As a result, the gate voltage of the transistor 628 is pulled sufficiently high to fully couple the first intermediate node 614 to the second intermediate node 616 without a threshold voltage (Vt) drop through the transistor 628.

Likewise, the input of an inverter 632 may be substantially constant by an RC timer circuit 630. The RC timer circuit 630 may include a transistor 644 and a capacitor 645. The gate of the transistor 644 may be coupled to ground. The output of the inverter 632, therefore, is coupled to Vcc through the inverters 626 and 620. Thus, the elevated inverter 632 output pulls the gate of the transistor 634 to a high voltage. As a result, the gate voltage of the transistor 634 is pulled sufficiently high to fully couple the second intermediate node 616 to ground without a threshold voltage (Vt) drop through transistor 628.

The stacked-gate PMOS clamp circuit 600, therefore, couples the gates of discharge transistors 602, 604 and 606 to substrate ground during an ESD event. With the gates of these transistors fully coupled to ground, the ESD discharge path can sink relatively large currents. Over a longer time period, the RC timer circuits 618, 624 and 630 charge the capacitors 641, 643 and 645 to flip the inverter circuits and turn OFF the transistors 602, 604 and 606.

Figure 9:
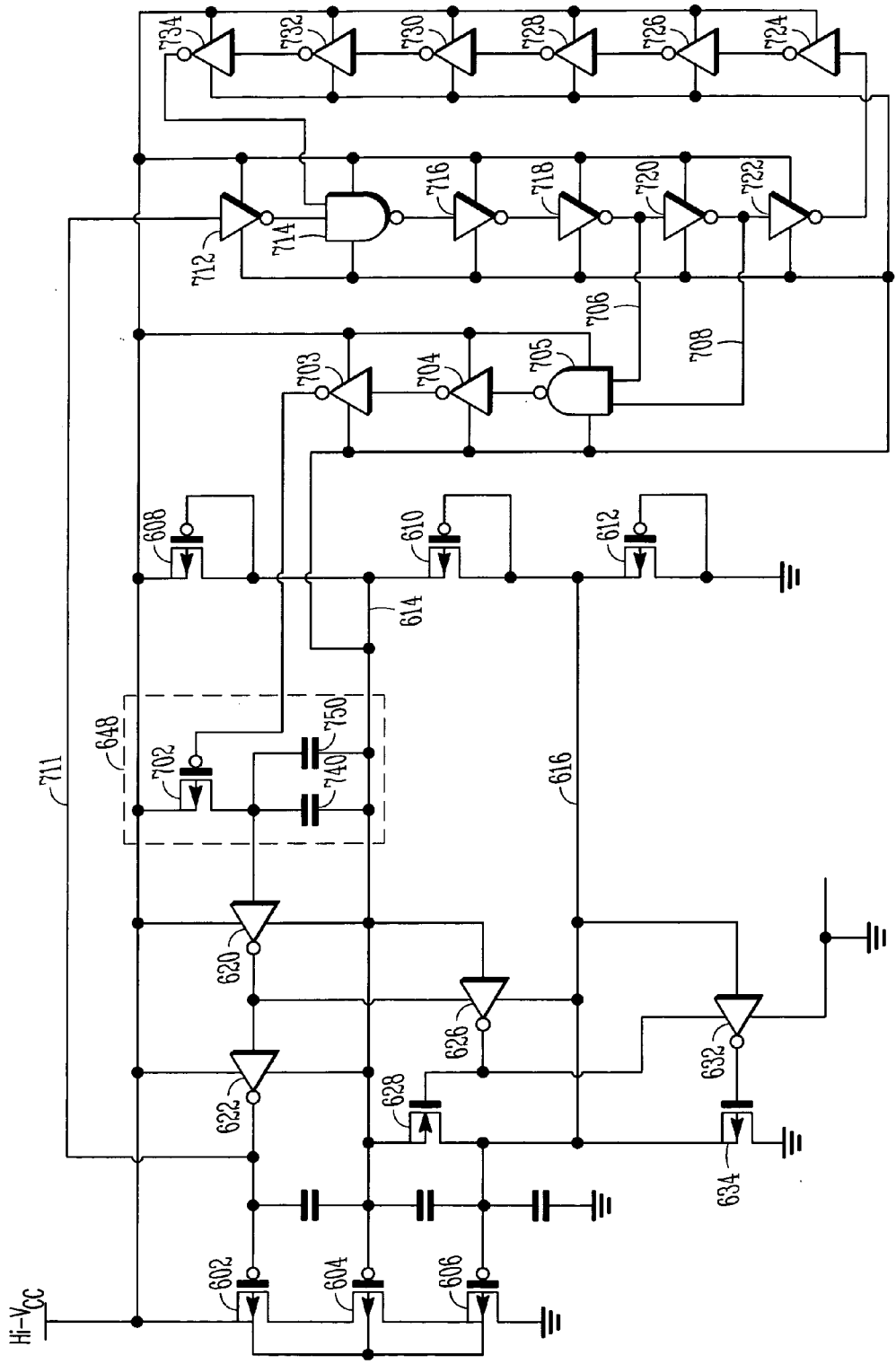
FIG. 9 is a circuit diagram of a clamp circuit having a stacked-gate PMOS transistor and a ring oscillator timer circuit according to an example embodiment of the present invention.

FIG. 9 shows a PMOS clamping circuit having a ring oscillator timer circuit according to an example embodiment of the present invention. Other embodiments and configurations are also within the scope of the present invention. The RO timer circuit shown in FIG. 9 may correspond to the RO timer circuit shown in FIG. 5. FIG. 9 shows a three-stack clamping circuit having one RC timer 648. FIG. 9 utilizes a shorter channel device (i.e., a transistor 702) having a gate coupled to the node 614 with a low duty cycle that is achieved by use of the RO circuit. The ring oscillator circuit may include a series of invertors 712, 716, 718, 720, 722, 724, 726, 728, 730, 732, 734, and a NAND gate 714 coupled in series. Each of the elements of the RO circuit may be coupled between Hi-Vcc and the potential of the node 614. The series of inverters act as the RO circuit. The RO circuit may receive an input signal along a signal line 711 to the inverter 712. The RO circuit may be coupled by signal lines 706 and 708 to a NAND gate 705, which outputs a signal through an inverter 704 and an inverter 703 to the gate of the transistor 702. In this example, the RO circuit is an eleven-stage ring oscillator circuit formed by the eleven inverters coupled in series. Other numbers of stages and configurations of the RO circuit are also within the scope of the present invention.

When the gate of the transistor 702 reaches the potential of the first intermediate node 614, a current pulse may be received at a capacitor 740 and a capacitor 750. The gate of the transistor 702 may reach the potential of the node 614 based on inputs to the NAND gate 705 (along the signal lines 706 and 708) from the ring oscillator circuit. In this example, the signal line 706 may be coupled to a node between the inverter 718 and the inverter 720 and the signal line 708 may be coupled to a node between the inverter 720 and the inverter 722. The gate of the transistor 702 may reach of the potential of the node 614 for a very short time once per complete cycle of the ring oscillator circuit. This may occur when the inverter 718 changes state from a HIGH to a LOW. Thus, the transistor 702 (such as a 4 m long resistive device) may become effectively a much higher value of resistance. FIG. 9 also shows a first capacitor 740 and a second capacitor 750 coupled between the transistor 702 and the first intermediate node 614.

Embodiments of the present invention have been described for improving RC timers used in PMOS ESD clamps. Embodiments of the present invention may employ circuits having ring oscillators and logic gates to produce a fast pulse with low duty cycle. The pulse may temporarily turn ON a FET with moderate channel length (effectively the resistor of an RC timer), and in so doing may increase the effective resistance of the device by a substantial amount. This increase is in inverse proportion to the duty cycle of the pulse. The duty cycle may be reduced further, in an area-efficient way, by use of counter circuits whose area grows with the logarithm of the desired time period. These methods may be extended to timers in voltage-tolerant, high-voltage clamps, and folded into advanced techniques for limiting the timers in such voltage-tolerant clamps to a single circuit.

The ring oscillator (RO) based timers may be advantageous in submicron CMOS processes with substantial gate current. In those technologies, the long-channel PMOS FET used as resistive pullup becomes problematic, due to gate current in itself and in associated capacitors. The gated shorter-channel PMOS device, when combined with a leak proof metal-polycapacitor, may solve this problem.

Before the arrival of the substantial gate current in submicron CMOS technology, these circuits may not have been needed for this application because there was no particular difficulty with simple RC timer circuits.

Embodiments of the present invention may be implemented with various changes and substitutions to the illustrated embodiments. For example, capacitors shown as implemented with PFETs or NFETs might also be implemented with other capacitor structures that can be fabricated in microelectronic manufacturing processes such as metal-to-metal, polysilicon-to-polysilicon, or metal-to-polysilicon capacitors. Further, inverters relate to circuits that accept at least one input signal and produce at least one output signal wherein the at least one output signal transitions from a first state to a second state in response to a first transition of the at least one input signal, and wherein the output signal transitions from the second state to the first state in response to a second transition of the input signal. Other examples of inverting circuits include NAND gates and NOR gates (or their logical equivalence).

Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, the present invention is not limited to any specific combination of hardware.

Any reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit comprising:
   a current sinking device having a first control terminal;
   a control circuit including a transistor and a capacitor and having an output terminal coupled to the first control terminal of said current sinking device; and
   a ring oscillator timer circuit to couple to a control terminal of said control circuit, wherein the ring oscillator timer circuit is coupled to a gate of said transistor, the ring oscillator timer circuit includes a number of ring oscillator stages, and the transistor has a resistance proportional to the number of ring oscillator stages.

2. The circuit of claim 1, wherein the ring oscillator timer circuit includes at least ten inverter circuits coupled in series.

3. The circuit of claim 1, wherein said ring oscillator timer circuit comprises a series of inverter circuits.

4. The circuit of claim 3, wherein said ring oscillator timer circuit further comprises a logic circuit to perform a logical NAND operation based on input signals.

5. The circuit of claim 4, wherein inputs of said logic circuit are to couple between outputs of adjacent inverter circuits, and said logic circuit to perform a logical NAND operation on said input signals received on said inputs.

6. The circuit of claim 1, wherein said current sinking device comprises at least one transistor.

7. The circuit of claim 6, wherein an input to said ring oscillator timer circuit is to couple to a gate of said at least one transistor.

8. The circuit of claim 1, wherein said ring oscillator timer circuit comprises at least one counter circuit.

9. The circuit of claim 8, wherein said at least one counter circuit comprises a flip-flop circuit.

10. An integrated circuit comprising an electrostatic discharge protection circuit having a ring oscillator timer circuit, the ring oscillator timer circuit having an output coupled to a timer circuit, the timer circuit including a transistor and a capacitor, wherein the output coupled to the timer circuit provides a signal at a gate of the transistor, wherein the transistor has a resistance proportional to an area used for the ring oscillator circuit,
   wherein said electrostatic discharge protection circuit comprises a power supply clamp having a current sinking device to couple a power supply terminal and a first node in response to an electrostatic event.

11. The integrated circuit of claim 10, wherein said first node comprises ground.

12. The integrated circuit of claim 10, wherein said current sinking device comprises a transistor.

13. An integrated circuit comprising an electrostatic discharge protection circuit having a ring oscillator timer circuit, the ring oscillator timer circuit having an output coupled to a timer circuit, the timer circuit including a transistor and a capacitor, wherein the output coupled to the timer circuit provides a signal at a gate of the transistor, wherein the transistor has a resistance proportional to an area used for the ring oscillator circuit,
   wherein said electrostatic discharge protection circuit comprises a power supply clamp having a first current sinking device to couple a power supply terminal and a first node during an electrostatic event and a second current sinking device to couple said first node and a second node in response to said electrostatic event.

14. The integrated circuit of claim 13, wherein said first node comprises a first intermediate node and said second node comprises ground.

15. The integrated circuit of claim 13, further comprising internal circuitry to perform a desired function.

16. An electrostatic discharge protection circuit comprising:
   a first electrically conductive element to couple between a power source and a first node, the first electrically conductive element having a control input terminal;
   a discharge path control circuit having an output terminal to couple to the control input terminal of the first electrically conductive element;
   a timer circuit including a transistor and a capacitor and having an output terminal to couple to the input terminal of said discharge path control circuit; and
   a ring oscillator timer circuit having an output terminal to couple to an input terminal of said timer circuit, the ring oscillator timer circuit coupled to a gate of the transistor,
   wherein said discharge path control circuit comprises a first inverting circuit stage having an input terminal to couple to the output terminal of said timer circuit and an output terminal, and a second inverting circuit stage having an output terminal to couple to the control input terminal of said first electrically conductive element and an input terminal to couple to the output terminal of said first inverting circuit stage.

17. The electrostatic discharge protection circuit of claim 16, wherein said ring oscillator timer circuit provides a signal at the gate of said transistor.

18. The electrostatic discharge protection circuit of claim 16, wherein said ring oscillator timer circuit comprises a series of inverter circuits.

19. The electrostatic discharge protection circuit of claim 18, wherein said ring oscillator timer circuit further comprises a first logic circuit to perform a logical NAND operation based on input signals.

20. The electrostatic discharge protection circuit of claim 19, wherein inputs of said first logic circuit are to couple between outputs of adjacent inverter circuits, and said first logic circuit to perform a logical NAND operation on said input signals received on said inputs.

21. The electrostatic discharge protection circuit of claim 16, wherein said first electrically conductive element comprises at least one transistor.

22. The electrostatic discharge protection circuit of claim 21, wherein an input to said ring oscillator timer circuit is to couple to a gate of said at least one transistor.

23. The electrostatic discharge protection circuit of claim 16, wherein said ring oscillator timer circuit comprises at least one counter circuit.

24. The electrostatic discharge protection circuit of claim 23, wherein said at least one counter circuit comprises a flip-flop circuit.

25. The electrostatic discharge protection circuit of claim 16, wherein said first node comprises ground.

26. The electrostatic discharge protection circuit of claim 16, further comprising a second electrically conductive element between said first node and a second node, the second electrically conductive element having a control input terminal to couple to said second node.

27. The electrostatic discharge protection circuit of claim 26, further comprising a third electrically conductive element between said second node and a third node, said third electrically conductive element having a control input terminal to couple to said third node.

28. A system comprising:
a voltage supply;
circuitry to be powered by said voltage supply and perform a desired function;
an electrostatic discharge protection circuit including:
a current sinking device having a first control terminal;
a control circuit including a transistor and a capacitor and having an output terminal coupled to the first control terminal of said current sinking device; and
a ring oscillator timer circuit to couple to a control terminal of said control circuit, the ring oscillator timer circuit coupled to a gate of the transistor, the ring oscillator timer circuit includes a number of ring oscillator stages, and the transistor has a resistance proportional to the number of ring oscillator stages.

29. The system of claim 28, wherein said circuitry and said electrostatic discharge protection circuit are provided on an integrated circuit.

30. The system of claim 28, wherein said ring oscillator timer circuit provides a signal at the gate of said transistor.

* * * * *